(12) United States Patent
Xiao

(10) Patent No.: US 8,754,372 B2
(45) Date of Patent: *Jun. 17, 2014

(54) STRUCTURE AND METHOD FOR DETERMINING A DEFECT IN INTEGRATED CIRCUIT MANUFACTURING PROCESS

(75) Inventor: Hong Xiao, Pleasanton, CA (US)

(73) Assignee: Hermes Microvision Inc., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/312,152

(22) Filed: Dec. 6, 2011

(65) Prior Publication Data

US 2012/0074314 A1  Mar. 29, 2012

Related U.S. Application Data

(63) Continuation of application No. 12/240,048, filed on Sep. 29, 2008, now Pat. No. 8,193,491.

(51) Int. Cl.
*H01J 37/26* (2006.01)

(52) U.S. Cl.
CPC ......... *H01J 37/26* (2013.01); *H01J 2237/2814* (2013.01); *H01J 2237/24592* (2013.01)
USPC ........... 250/307; 250/306; 250/310; 250/311; 324/762.01; 324/762.05; 324/719; 382/181; 382/274

(58) Field of Classification Search
CPC .................. H01J 37/26; H01J 2237/26; H01J 2237/2602; H01J 2237/2608; H01J 2237/2813; H01J 2237/2814; H01J 2237/2817; H01J 2237/24564; H01J 2237/24592
USPC ......................... 250/306, 307, 309, 310, 311; 324/762.01, 762.05, 719; 382/181, 274
See application file for complete search history.

(56) References Cited

U.S. PATENT DOCUMENTS

| 5,144,225 A | * | 9/1992 | Talbot et al. | 324/73.1 |
| 8,193,491 B2 | * | 6/2012 | Xiao | 250/307 |
| 2006/0192904 A1 | * | 8/2006 | Almogy et al. | 349/6 |

* cited by examiner

*Primary Examiner* — Nicole Ippolito
(74) *Attorney, Agent, or Firm* — WPAT, PC; Justin King

(57) ABSTRACT

The present invention discloses a structure and a method for determining a defect in integrated circuit manufacturing process. Test keys are designed for the structure to be the interlaced arrays of grounded and floating conductive cylinders, and the microscopic image can be predicted to be an interlaced pattern of bright voltage contrast (BVC) and dark voltage contrast (DVC) signals for a charged particle beam imaging system. The system can detect the defects by comparing patterns of the detected VC signals and the predicted VC signals.

4 Claims, 5 Drawing Sheets

STRUCTURE AND METHOD FOR DETERMINING A DEFECT IN INTEGRATED CIRCUIT MANUFACTURING PROCESS

CROSS REFERENCE

This application is a Continuing Application of U.S. application Ser. No. 12/240,048, filed on Sep. 29, 2008, currently pending.

FIELD OF THE INVENTION

The present invention generally relates to an integrated circuit (IC) manufacturing process using a charged particle beam imaging system, and more particularly to a test structure and method for determining a defect in IC manufacturing process.

BACKGROUND OF THE INVENTION

Charged particle beam imaging system, such as an electron beam imaging (EBI) system, is increasingly applied in advanced IC chip manufacturing. The detection resolution of EBI is high enough to detect tiny physical defects beyond the ability of optical defect imaging systems, and the EBI can be used to detect electrical defects of integrated circuitry, such as an open defect, a short or a leakage defect underneath the wafer surface by detecting voltage contrast (VC) due to the surface charge induced gray level (GL) variation.

In dynamic random access memory (DRAM) manufacturing, electrical short between neighboring storage node (SN) cylinders and/or conductive contact plugs, which are underneath the SN cylinders, are fatal, where the latter is called a piping defect. In such scenarios, it is difficult to detect the electrical short defect because the VC difference between normal and defective cylinders is very small. Moreover, the detection of the short defects is getting more difficult under the trend of the miniaturization of DRAM and large aspect ratio of the SN cylinder.

SUMMARY OF THE INVENTION

A feature of this invention is to provide a method for determining a defect on a sample of semiconductor devices, also thereby helping to verify the manufacturing process.

Another feature of this invention is to provide a test structure for determining a defect of a semiconductor device, also thereby helping to verify the manufacturing process.

For achieving the above features, a method for determining a defect on a sample of semiconductor devices is provided according to an embodiment of this invention. First, a plurality of first cylindrical conductors and a plurality of second cylindrical conductors are disposed on the sample. Each of the first cylindrical conductors is grounded, and each of the second cylindrical conductors is floated. Moreover, the first cylindrical conductor and the second cylindrical conductor are interlaced. Next, a charged particle microscopic image of the sample is obtained. Then the defect on the sample can be monitored via the voltage contrast (VC) of the first and second cylindrical conductors from the charged particle microscopic image.

For achieving the above features, a test structure for determining a defect of a semiconductor device is provided according to an embodiment of this invention. The structure includes a plurality of first cylindrical conductors and a plurality of second cylindrical conductors, wherein the first cylindrical conductors and second cylindrical conductors are interlaced. Each of said first cylindrical conductors is grounded and, each of said second cylindrical conductors is floated. Then the defect can be determined by monitoring the voltage contrast from a charged particle microscopic image of the first and second cylindrical conductors.

DESCRIPTION OF THE EXEMPLARY EMBODIMENTS

The present invention generally relates to the integrated circuit manufacturing process using a particle beam imaging system. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

The process is to be used in IC manufacturing, a process of fabricating a DRAM is taken as an example in order to better illustrate an embodiment. Other applications are also possible as will be appreciated by those skilled in the art.

Figures 1A, 1B:
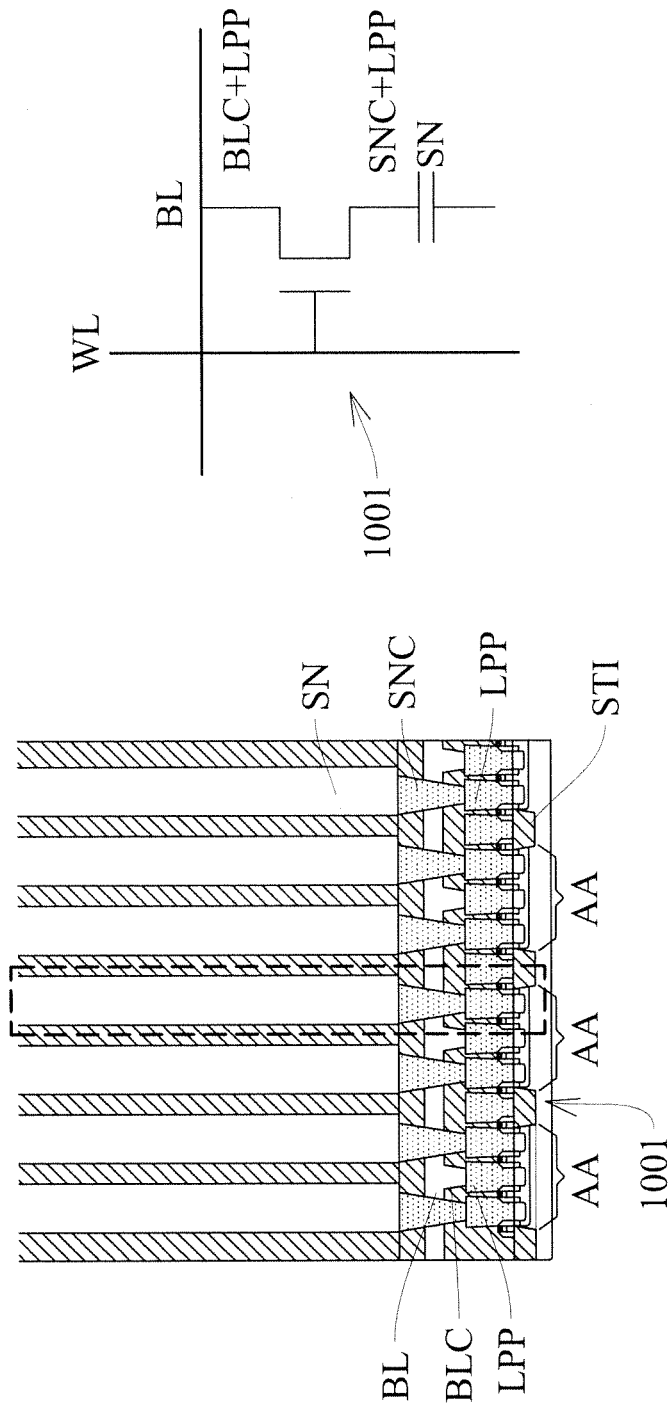
FIG. 1A is an illustration of a segment of DRAM cells and FIG. 1B shows the equivalent circuit of such DRAM cell.

FIG. 1A shows the structure of a segment of DRAM, which includes a plurality of cells 1001. The area surrounded by the dotted line in FIG. 1A indicates a DRAM cell 1001 and its equivalent circuit is shown in FIG. 1B.

Bit line (BL) is connected to the source/drain of a transistor via bit line contact (BLC) and a conductive plug which is implemented as a landing poly plug (LPP). The device includes the storage nodes (SNs) or cylinder conductors on the top, and the SNs or cylinder conductors are connected to the drain/source of the transistor via storage node contact (SNC) and the LPP. The word line (WL), not shown in FIG. 1A, extends to the gate of the transistor. For the bottom of the DRAM structure shown in FIG. 1A, shallow trench isolations (STIs) divide the bottom into a plurality of active areas (AAs), and the BL and/or SN cylinders are connected to the AA via LPP.

Figure 2:
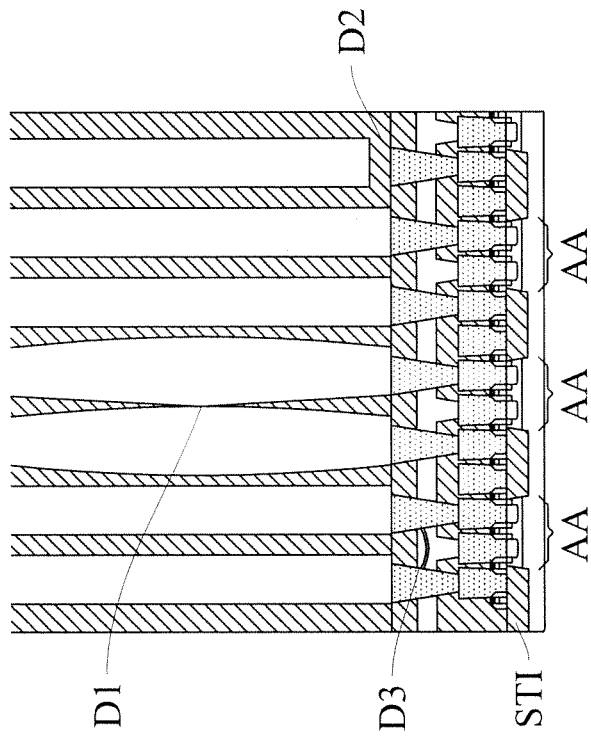
FIG. 2 shows the various defects of DRAM.

Different from the ideal DRAM shown in FIG. 1A, defects may exist in real DRAM. FIG. 2 illustrates a short defect D1 between two SN cylinders due to etch profile bowing, a contact open defect D2 of SN and a piping defect D3, another type of short defect which is an unwanted channel between two SNCs.

For the electron beam imaging (EBI) system, for example, the defective SN cylinders, such as open circuit or short circuit, are designed to enhance EBI VC signal and the detection of the short defects between SN cylinders. The open defect can be easily detected by EBI as a dark VC (DVC) signal. The short defect, including piping defect, can be detected by EBI as a bright VC (BVC) signal. However, it is difficult to identify the short defect within an EBI image because the grey levels (GV) of normal and defective devices do not well distinguish from one another.

Figure 3:
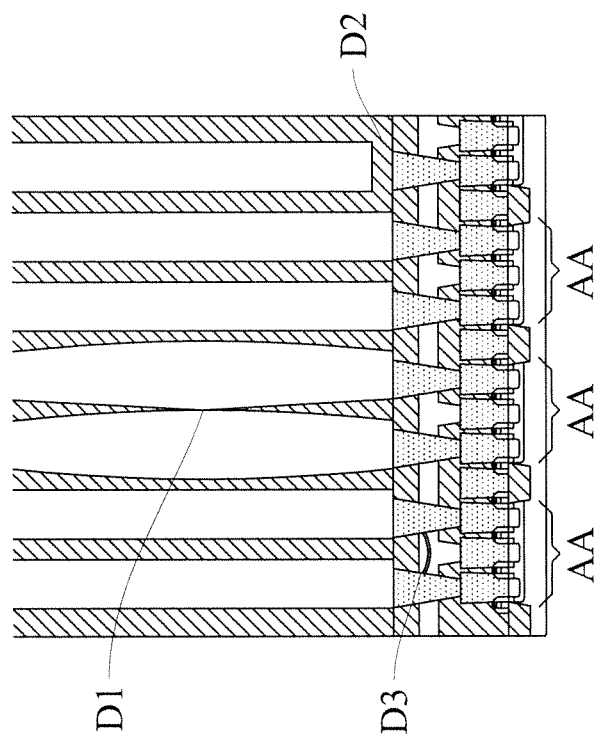
FIG. 3 is an illustration of various designed defective test DRAMs according to this invention.

The test DRAM is designed for detecting the short defect between, especially neighboring, storage nodes, storage node contacts or landing poly plugs. About one half of the SN cylinders are connected to the active area (AA) by LPP and the remaining SN cylinders are rendered floating. The SN cylinders connected to AAs and the floating SN cylinders are interlaced, and the AAs can be grounded. For example, as shown in FIG. 3, the isolation members, implemented by STIs, cover a portion of the AAs to isolate half SN cylinders from the AA, and the isolated SN cylinders and the non-isolated cylinders are interlaced thereby forming the test DRAM.

The charged particle beam is partially scattered back at the surface of the test DRAM and together with the emitted secondary electrons are collected by a sensor to obtain a microscopic image, for example a scanning electron microscopic image. Thereafter, the microscopic images are interpreted in the form of voltage contrast (VC) signals, which can be further used to determine the defects of the test DRAM. In this embodiment, the floating SN cylinders can be detected by EBI as the dark voltage contrast (DVC) signals and the grounded SN cylinder as bright voltage contrast (BVC) signals. The BVC and DVC signals form an image detected by EBI which corresponds to one specific pattern of the designed test DRAM.

Figures 4A, 4B:
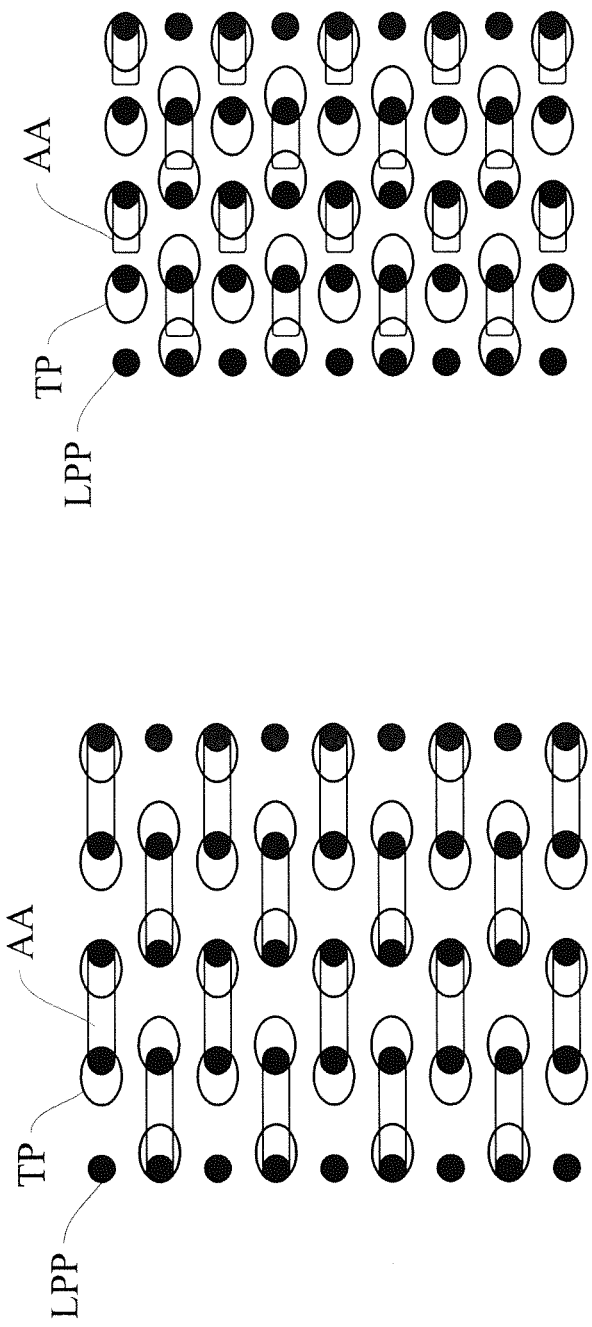
FIG. 4A and FIG. 4B show the top views of a normal DRAM and an embodiment of test DRAM of this invention, respectively.

FIG. 4A illustrate a top view of a normal DRAM, and FIG. 4B illustrate a top view of an example test DRAM, respectively, wherein the black dots indicate the SN cylinders, the circles indicate the test points (TP) and the stick blocks indicate the AAs.

In charged particle beam microscopic images, for example an SEM image, the grounded features emit more secondary electrons upon being bombarded by the electron beam to form brighter areas in an image, called bright voltage contrast (BVC). On the contrary, those floating features emit less or no secondary electrons to form darker areas in the image, called dark voltage contrast (DVC).

Figure 5B:
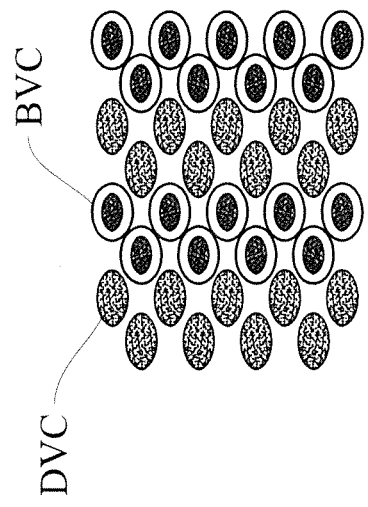
FIG. 5A and FIG. 5B are the VC-signal images of a normal DRAM and a non-defective test DRAM in an embodiment of this invention.
Figure 5A:
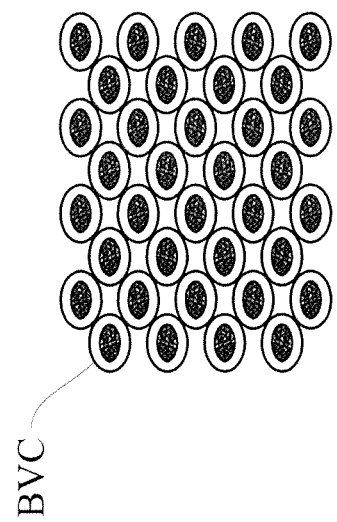

Testing a conventional non-defective normal DRAM, the VC signals are all BVC signals as shown as bright circles in FIG. 5A. Testing a non-defective test DRAM of this invention, the BVC and the DVC signals are alternately lined up in columns as shown in FIG. 5B.

Figure 6A:
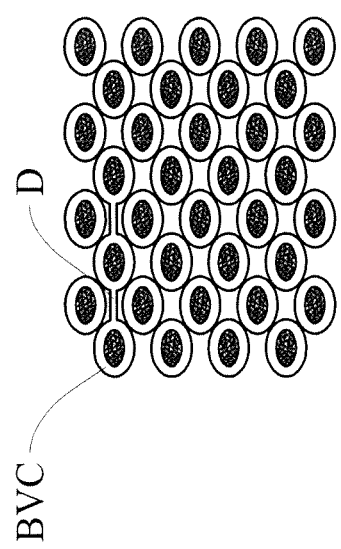
FIG. 6A and FIG. 6B are the VC-signal images of a normal DRAM with electrical shorts and a defective test DRAM (with electrical shorts) in an embodiment of this invention.
Figure 6B:
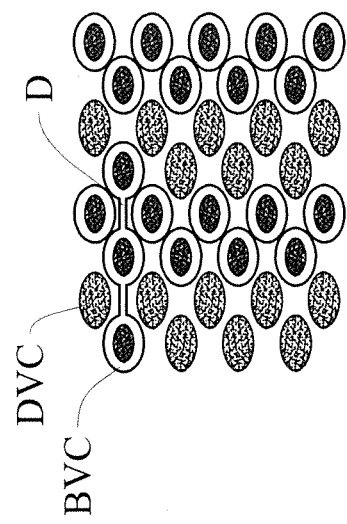

An image of testing a conventional defective normal DRAM is shown in FIG. 6A. An electrical short defect display a bright strip D connecting its neighboring test points (TP). As shown in FIG. 6A, together they display BVC in the shape of a row of connected test points. Comparing FIG. 6A with FIG. 5A, as all test points in the image are shown as BVC, so the bright strip D is not easily identified from surrounding bright test points. On the other hand, an image of defective test DRAM of this invention is shown in FIG. 6B. An electrical short defect D, as a bright strip in FIG. 6B, and its neighboring test points (TP) are still connected to form a BVC in the shape of a row of connected test points in the image. In this case however, the BVC bright strip stands out from the surrounding DVC test point columns which cause an obvious VC pattern difference between FIGS. 5B and 6B. Therefore, by using the test structure in accordance with the present invention an electrical short defect can be easily identified using charged particle beam imaging technique, such as SEM.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A test structure for determining a defect of a semiconductor device, comprising:
   a plurality first cylindrical conductors, each of said first cylindrical conductors being grounded wherein said first cylindrical conductor is grounded through at least one first conductive plug and an active area wherein said first conductive plug and said active area are under said first cylindrical conductor; and
   a plurality of second cylindrical conductors, each of said second cylindrical conductors being floated, said first and second cylindrical conductors being interlaced and vertical to a upper surface of said test structure wherein said second cylindrical conductor is floated through at least one second conductive plug and an isolation member,
   wherein said defect is determined by monitoring the voltage contrast from a charged particle microscope image of said first and second cylindrical conductors.

2. The test structure for determining a defect of a semiconductor device of claim 1, wherein said defect comprises a piping defect between said first and second conductive plugs.

3. The test structure for determining a defect of a semiconductor device of claim 1, wherein said defect comprises an electrical short between said first and second cylindrical conductors.

4. The test structure for determining a defect of a semiconductor device of claim 1, wherein said defect is determined by monitoring a bright voltage contrast of said first and second cylindrical conductors.

* * * * *